US007817318B2

(12) United States Patent
Torashima et al.

(10) Patent No.: US 7,817,318 B2

(45) Date of Patent: Oct. 19, 2010

(54) OSCILLATING SYSTEM AND OPTICAL DEFLECTOR

(75) Inventors: Kazutoshi Torashima, Kawasaki (JP); Yasuhiro Shimada, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 704 days.

(21) Appl. No.: 11/608,343

(22) Filed: Dec. 8, 2006

(65) Prior Publication Data

US 2007/0144867 A1 Jun. 28, 2007

(30) Foreign Application Priority Data

Dec. 9, 2005 (JP) ............................ 2005-356139

(51) Int. Cl.
*G02B 26/08* (2006.01)

(52) U.S. Cl. .............. 359/199.3; 359/200.7; 359/224.1; 310/36

(58) Field of Classification Search .............. 359/199.3, 359/200.7, 224.1–224.2
See application file for complete search history.

(56) References Cited

U.S. PATENT DOCUMENTS

| | | | |
|---|---|---|---|
| 6,201,226 | B1 | 3/2001 | Shimada et al. |
| 6,215,114 | B1 | 4/2001 | Yagi et al. |
| 6,335,522 | B1 | 1/2002 | Shimada et al. |
| 6,408,123 | B1 | 6/2002 | Kuroda et al. |
| 6,436,265 | B1 | 8/2002 | Shimada et al. |
| 6,477,132 | B1 | 11/2002 | Azuma et al. |
| 6,900,925 | B2 | 5/2005 | Kato et al. |
| 7,038,834 | B2 | 5/2006 | Kato et al. |
| 7,220,009 | B2 | 5/2007 | Shimada et al. |
| 2005/0179985 | A1 | 8/2005 | Kato et al. |
| 2006/0152785 | A1 | 7/2006 | Yasuda et al. |
| 2007/0144867 | A1 | 6/2007 | Torashima et al. |

FOREIGN PATENT DOCUMENTS

| | | |
|---|---|---|
| JP | 2002-311372 | 10/2002 |
| JP | 2005-181926 | 7/2005 |

OTHER PUBLICATIONS

U.S. Appl. No. 11/753,062, filed May 24, 2007, Takhisa Kato.
U.S. Appl. No. 11/753,066, filed May 24, 2007, Takhisa Kato.
U.S. Appl. No. 11/739,968, filed Apr. 25, 2007, Takhisa Kato.
U.S. Appl. No. 11/753,057, filed May 24, 2007, Kazutoshi Torashima, et al.

*Primary Examiner*—James Phan
(74) *Attorney, Agent, or Firm*—Fitzpatrick, Cella, Harper & Scinto

(57) ABSTRACT

Disclosed is an oscillating system arranged so that a gravity center of a movable member and a torsional axis of a resilient support are easily registered with each other to prevent deformation of the movable member due to its dead weight or deviation of deformation from symmetrical deformation, wherein the oscillating system includes a substrate 301, a movable member 302 with hard magnetic members 310 and 311, resilient supports 304 and 305 for supporting the movable member for torsional vibration about a torsional axis 312 with respect to the substrate, and a magnetic field producing device for driving the movable member relative to the substrate, wherein the movable member 302 has recesses 306 and 307, and wherein the hard magnetic members are fixed while their end portions are aligned with end faces 308 and 309 corresponding to the recesses.

7 Claims, 10 Drawing Sheets

OSCILLATING SYSTEM AND OPTICAL DEFLECTOR

FIELD OF THE INVENTION AND RELATED ART

This invention relates to an oscillating system usable, for example, in a resonance type optical deflector having a movable member, and also to an optical instrument such as an image forming apparatus having such oscillating system. The present invention is suitably applicable, for example, to scanning type projection displays for projecting an image through deflective scan of light, image forming apparatuses based on electrophotographic process such as a laser beam printer and a digital copying machine, and optical data reading machines such as a bar code reader.

Many proposals have been made in regard to resonance type optical deflectors having a mirror which is oscillated by resonance drive. Particularly, micromachine devices based on micromechanics technology using semiconductor processes (e.g., a micro optical deflector having a scanning mirror torsionally vibrating about a torsional rotation axis) have features such that the size can be made small and the power consumption is low.

FIG. 12 illustrates an example of optical deflector having a torsionally vibrating scanning mirror (see Patent Document No. 1 below).

The optical deflector shown in the sectional view of FIG. 12 has the following structure. A plate 1001 made of monocrystal silicon has a window 1002 in which a movable member 1003 is provided. The movable member 1003 is made of the same material as the plate 1001. There are a pair of resilient supports made of the same material as the plate 1001 and the movable member 1002. By means of these supporting portions, the movable member 1003 is supported by opposite window frames of the window 1002. The movable member 1003 is driven by driving means which comprises a magnetic member 1004 provided at the movable member 1003, and magnetic field producing means 1005 for applying, to the movable member 1003, an alternating magnetic field of a frequency corresponding to the resonance frequency $f_0$ of the movable member. A reflection surface 1006 is formed on the movable member 1003, and it reflects and deflects light 1007 projected thereto from a light source 1008.

In the optical deflector having such structure described above, the movable member 1003 provided inside the window 1002 of the plate 1001 made of monocrystal silicon, is supported by the window frames through a pair of resilient supports. Thus, this movable member 1003 has a resonance frequency $f_0$ that can be expressed by Equation (1) below, using a torsional spring constant K of the resilient supports and an inertial moment L determined by the weight and shape of the movable member 1003.

$$f_0=(1/2\pi)(K/L)^{1/2} \tag{1}$$

The movable member 1003 is provided with a magnetic member 1004. Therefore, by applying to this magnetic member an alternating magnetic field of a frequency corresponding to the resonance frequency $f_0$ of the movable member 1003, a magnetic force and a resilient restitution force of the resilient supports (beams) will be applied to the magnetic member 1004. Hence, the movable member 1003 can be oscillated by a small energy.

The movable member 1003 has a reflection surface 1006. By projecting light thereto from the light source 1008, the reflection light from it can be reciprocally scanned at the resonance frequency described above.

[Patent Document]

1. Japanese Laid-Open Patent Application, Publication No. 2002-311372

In image forming apparatuses such as laser beam printer and head mount displays wherein optical scan is carried out by use of an optical deflector such as described above, or in optical date reading machines for input devices such as bar code readers, for example, strict flatness is required in regard to the reflection surface, for example, that is provided to deflect the light.

Generally, however, in optical deflectors which needs high-speed operation (particularly, those having a mirror oscillated by resonance drive), distortion of the reflection surface or the like is a large factor that deteriorates the optical performance. Since a movable member with a reflection surface is torsionally vibrated within a predetermined angular range, a large angular acceleration is applied to it. Hence, during the drive, the movable member having a reflection surface is distorted due to an inertial force caused by the weight thereof, and as a result, the optical deflecting element such as a reflection surface is distorted largely. Deformation due to the dead weight described above degrades the optical characteristic of the optical deflecting element such as a reflection surface and, hence, the characteristic of the optical deflector itself. Particularly, if, when a magnetic member (magnet) is fixedly mounted on the movable member having such optical deflecting element (reflection surface), the gravity center of the magnetic member slightly deviates from the torsional axis, since it means that the torsional rotation axis slightly deviates from the center of the torsion spring, deformation due to the dead weight would be quite large.

SUMMARY OF THE INVENTION

It is accordingly an object of the present invention to provide a novel and unique oscillating system by which at least one of the inconveniences described above can be avoided or reduced.

In accordance with an aspect of the present invention, to achieve the above object, there is provided an oscillating system, comprising: a substrate; a movable member having a hard magnetic member; a resilient support for supporting said movable member for torsional vibration with respect to the substrate; and a magnetic field producing device for producing a magnetic field so as to cause vibration of said movable member; wherein said movable member has at least one positioning reference for determining the position of said hard magnetic member, and wherein said hard magnetic member is fixed while an end portion thereof is aligned with said positioning reference.

Briefly, in an oscillating system according to the present invention, the hard magnetic member can be fixed while an end portion thereof is brought into contact with the positioning reference. Namely, the end portion of the hard magnetic member is held in alignment with the positioning reference. As a result of this, the mounting positioning precision of the hard magnetic member is improved quite significantly. Therefore, once the overall shape of the hard magnetic member, the gravity center position, the end portion shape, the positioning reference, the general shape and so on are correctly determined beforehand, the gravity center of the movable member can easily be aligned with the torsional axis of the resilient support. Particularly, the gravity-center coordinate of the movable member having hard magnetic member, with respect to a direction which is parallel to the surface of the movable member having a reflection surface and which is perpendicular to the torsional axis of the resilient support, can be easily aligned with the coordinate of the torsional axis of the resilient support. Here, the state of "being aligned" or "alignment" does not always require complete alignment. Rather, a tolerable error may be included. Thus, deformation of the movable member is removed or, even if there remains deformation, it may be approximately laterally symmetric with respect to the torsional axis of the resilient support.

In this way, deformation of the movable member due to the dead weight thereof or deviation of deformation from point-symmetrical deformation can be avoided or reduced. Hence, when the oscillating system is incorporated into an optical deflector, degradation of optical characteristics of its reflection surface or the like can be prevented effectively.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B are schematic illustrations for explaining one possible form of the present invention, wherein FIG. 1A is a side view and FIG. 1B is a top plan view.

DESCRIPTION OF THE PREFERRED EMBODIMENTS

Preferred embodiments of the present invention will now be described with reference to the attached drawings.

First of all, referring to FIG. 1, one possible form of the present invention will be described in detail.

Figure 1A:
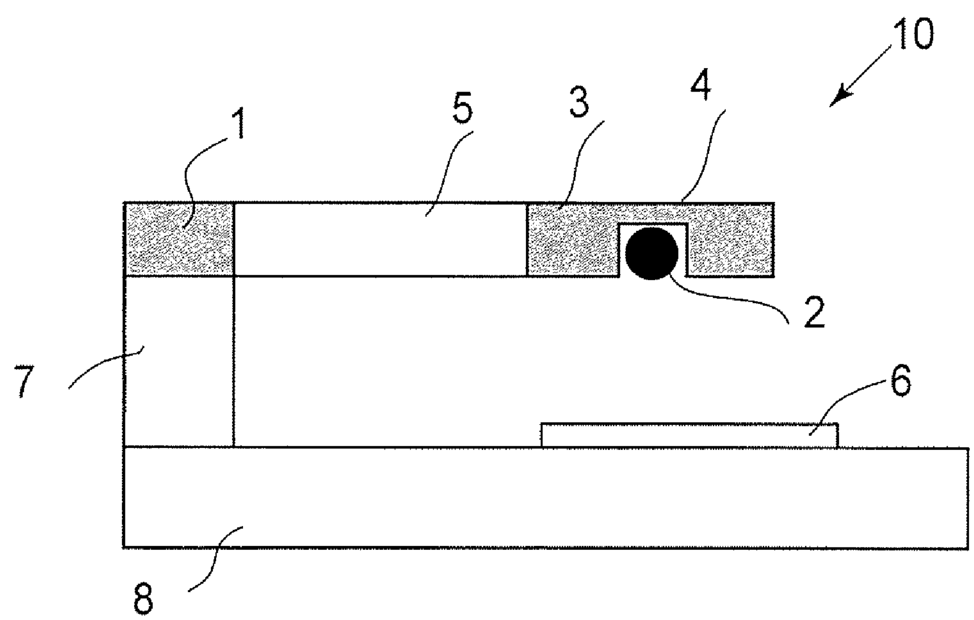
Figure 1B:
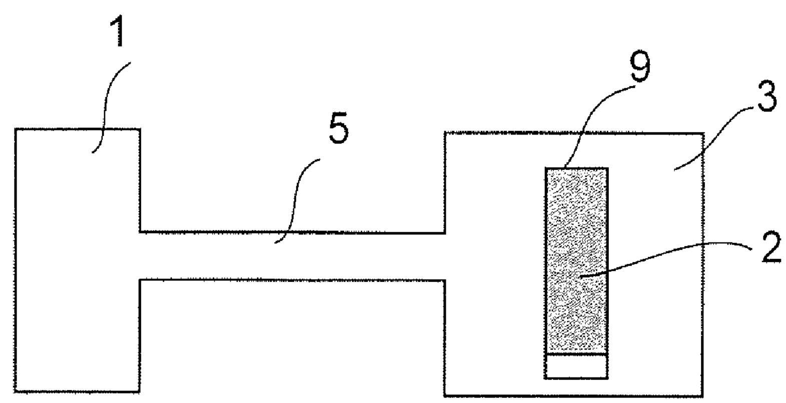

In FIG. 1, an optical deflector 10 according to this form of the present invention may include a substrate 1, a movable member 3 having at least one hard magnetic member (magnet) 2, a reflection surface 4 formed at the movable member, a resilient support for supporting the movable member for torsional vibration, and a magnetic field producing portion 6 for driving the movable member relative to the substrate. The reflection surface 4 may be made by providing, as required, a high-reflectance film such as a dielectric multilayered film, for example, upon one surface of the movable member 3. Although FIG. 1 shows an example wherein a single resilient support is used, the shape is not limited to this. A pair of resilient supports may be used to connect opposite sides of the movable member to the substrate, as will be described later. As a further alternative, a movable member connected to a magnet and a movable member having a reflection surface may be prepared separately, and these movable members may be connected to each other through a resilient support, such that the function may be divided thereby.

This optical deflector may have a resonance frequency $f_0$ that can be expressed by Equation (1) above, using a torsional spring constant K of the resilient support and the inertial moment L as determined by the weight and shape of the resonator (movable member), and this is as described hereinbefore.

The movable member may have a hard magnetic member and, in that occasion, by applying to this hard magnetic member an alternating magnetic field of a frequency corresponding to the resonance frequency of the movable member, the movable member can be vibrated to deflect light from the light source through the reflection surface at the resonance frequency. Again, this is as described hereinbefore.

At least one recess having a positioning reference may be provided at the surface of the movable member opposed to the reflection surface. Alternatively, at least one recess may be provided at each of opposite surfaces of the movable member. If the recess is going to be formed at the same surface as the reflection surface, preferably it may be formed at a position remote from the reflection surface so that it does not apply adverse influence thereto. When the hard magnetic member is mounted onto the movable member 3, the hard magnetic member may be fixed by bringing the same in contact with the positioning reference of the recess. In this manner, the hard magnetic member can be brought into alignment with the positioning reference.

Here, the shape of the positioning reference of the recess and the shape of the hard magnetic member may be designed beforehand so that, when the hard magnetic member is fixed by bringing the end portion of the same in contact with the positioning reference, the gravity center of the movable member having this hard magnetic member is aligned with the torsional axis of the resilient support. For example, if the hard magnetic member is attached to one surface of the movable member, for adjustment of the gravity center of the movable member having a hard magnetic member, a gravity center adjusting member may be provided on the other surface of the movable member.

Alternatively, the thickness of the movable member at a side of the torsional axis where no hard magnetic member is provided, may be made larger for the gravity center adjustment.

With these arrangements, the gravity center of the movable member including the hard magnetic member and the torsional axis of the resilient support (particularly, the coordinate of the gravity center of the movable member including the hard magnetic member and the coordinate of the torsional axis of the resilient support, with respect to a direction parallel to the reflection surface and perpendicular to the torsional axis of the resilient support) can be aligned with each other. Hence, deformation of the movable member due to the self-weight thereof or deviation of deformation from point-symmetrical deformation can be made smallest, and degradation of optical performance of the reflection surface can be prevented effectively.

As compared therewith, where a magnet is going to be simply fixed to a predetermined position upon a flat surface of the movable member by using an adhesive agent or the like, even if the shape or the like of the hard magnetic member is made exactly in accordance with the design, it would be very difficult to fix the hard magnetic member so that the gravity center of the movable member as a whole is aligned with the torsional axis of the resilient support.

It should be noted here that, although in FIG. 1 the recess is formed at the surface of the movable member, a protruded positioning reference may be provided at the surface of the movable member without using such recess, such that the hard magnetic member can be fixed by bringing the same in contact with the positioning reference.

Next, the principle of this possible form of the present invention for overcoming the inconveniences will be explained.

Figure 2A:
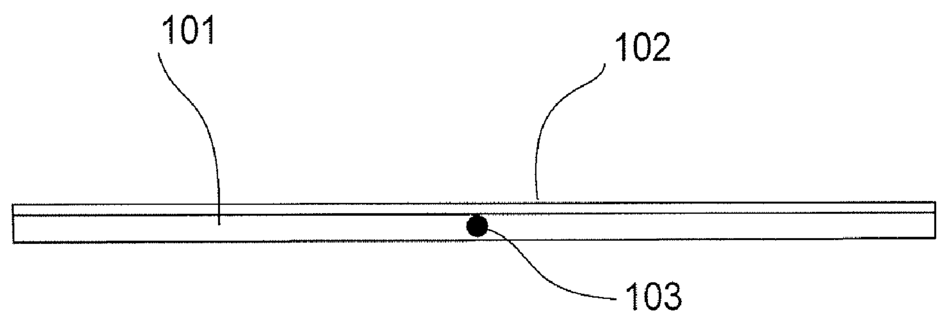
FIG. 2A is a schematic and sectional view of a movable member, for explaining the principle of the present invention.

FIG. 2A is a sectional view of a movable member 101, taking the torsional axis 103 as a normal line, in a case where the movable member 101 comprises a flat plate (rectangular parallelepiped). The optical deflector in this form of the present invention may be driven at a frequency about the resonance frequency to produce torsional vibration. Thus, the displacement angle of the movable member 101 with respect to time may change along a sine wave, and the largest deformation may occur at the displacement angle point where a largest angular speed applies (for example, if the whole of the vibration angles of the sine wave is used as a usable region of the optical deflector, it may be around the largest displacement angle).

Figure 2B:
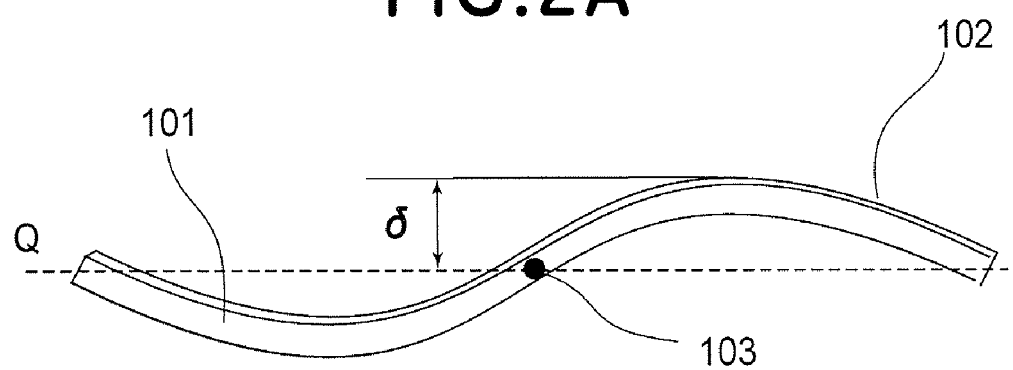
FIG. 2B is a schematic and sectional view for explaining deformation of the movable member.

FIG. 2B shows deformation of the movable member 101 as the deformation occurs. If deformation occurs in the movable member 101 as shown in FIG. 2B, the reflection surface 102 formed on the movable member 101 deforms similarly. If such deformation is very large or a large deviation occurs from symmetrical deformation, the flatness of the reflection surface 102 or the point symmetry thereof about the torsional axis cannot be assured throughout the usable region of the optical deflector, causing serious degradation of the optical performance.

Figure 3:
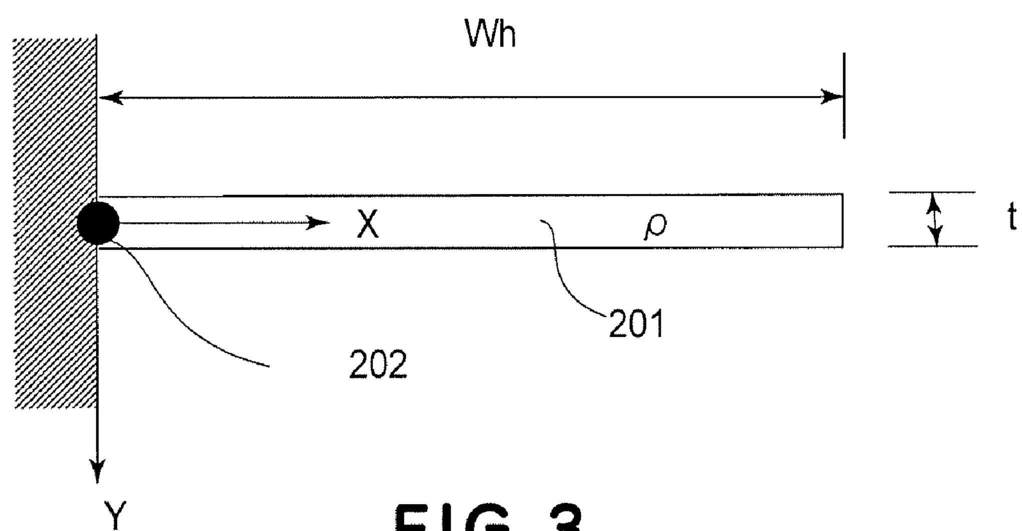
FIG. 3 is a schematic and enlarged sectional view, showing a half of the movable member, for explaining the principle of the present invention.

If the movable member 101 comprises a rectangular parallelepiped, deformation of the movable member 101 during torsional vibration can be explained in accordance with an approximation model shown in FIG. 3. FIG. 3 illustrates a half of the movable member 101, from the center of the section shown in FIG. 2A. The deformation of the movable member 101 is approximately point-symmetrical with respect to the torsional axis 103, and it can be approximated as deformation of a beam having a central portion supported by a fixed end 202. If an angular speed $Q(2pf)^2$ is applied to the movable member 202 due to torsional vibration, where Q is the displacement angle and f is the frequency of torsional vibration, the deformation (flexure) y of the beam of FIG. 3 can be expressed by Equation (2) below.

$$y = 12 \cdot \Theta \cdot (2\pi f)^2 \cdot \frac{\rho W_h^5}{Et^2}\left(\frac{x^5}{120} - \frac{x^3}{12} + \frac{x^2}{6}\right) \tag{2}$$

wherein x is the dimensionless distance as shown in FIG. 3, ρ is the density of the member, E is the Young's module, t is the thickness, and $W_h$ is a half value of the mirror width W.

Here, the distance δ of the deformation (flexure) y from the reference plane Q is influential to the decrease of optical performance of the reflection surface 102. If the reference plane Q is defined as depicted in FIG. 2B, the distance δ can be expressed by Equation (3) below.

$$\delta \approx 0.23 \cdot \Theta \cdot f^2 \cdot \frac{\rho W^5}{Et^2} \tag{3}$$

As discussed above, the distance δ is proportional to the displacement angle Θ, the fifth power of the mirror width W and the square of the frequency f. Therefore, if a large reflection-surface opening, a large deflection angle or higher-frequency drive should be provided, the influence of deformation of the movable member due to its dead weight would be quite heavy. Furthermore, if the gravity center of the movable member and the torsional axis of the resilient support are misaligned, deformation of the movable member will be asymmetric with respect to the torsional axis of the resilient support, such that the deformation of the movable member would grow steeply. The misalignment mentioned above concerns a deviation between the gravity-center coordinate of the movable member having the hard magnetic member and the coordinate of the torsional axis of the resilient support, with respect to a direction which is parallel to the reflection surface mentioned hereinbefore and which is perpendicular to the torsional axis of the resilient support.

Hence, by bringing the hard magnetic member in contact with the positioning reference so as to align the gravity center of the movable member with the torsional axis of the resilient support, adverse influence of deformation due to the self weight can be made smallest. In one example, if the misalignment between the gravity center of the movable member and the torsional axis of the resilient support is about 5 μm or less, the gravity center of the movable member can be aligned with the torsional axis; deformation of the movable member can be approximately point-symmetric with respect to the torsional axis; and deformation of the light spot caused by deformation due to the weight can be suppressed into a tolerable range.

If, in this form of the present invention, a plurality of hard magnetic members are going to be fixed while bringing each member in contact with one end face of each of plural recesses (see FIG. 5), preferably all the hard magnetic members may be contacted at different sides. For example, the hard magnetic members may preferably be disposed so that their gravity centers are placed alternately at the opposite sides of the torsional axis. With this arrangement, the gravity center of the movable member can be easily and aligned with the torsional axis of the resilient support, wherein the state “being aligned” is in the sense mentioned hereinbefore.

Figure 6:
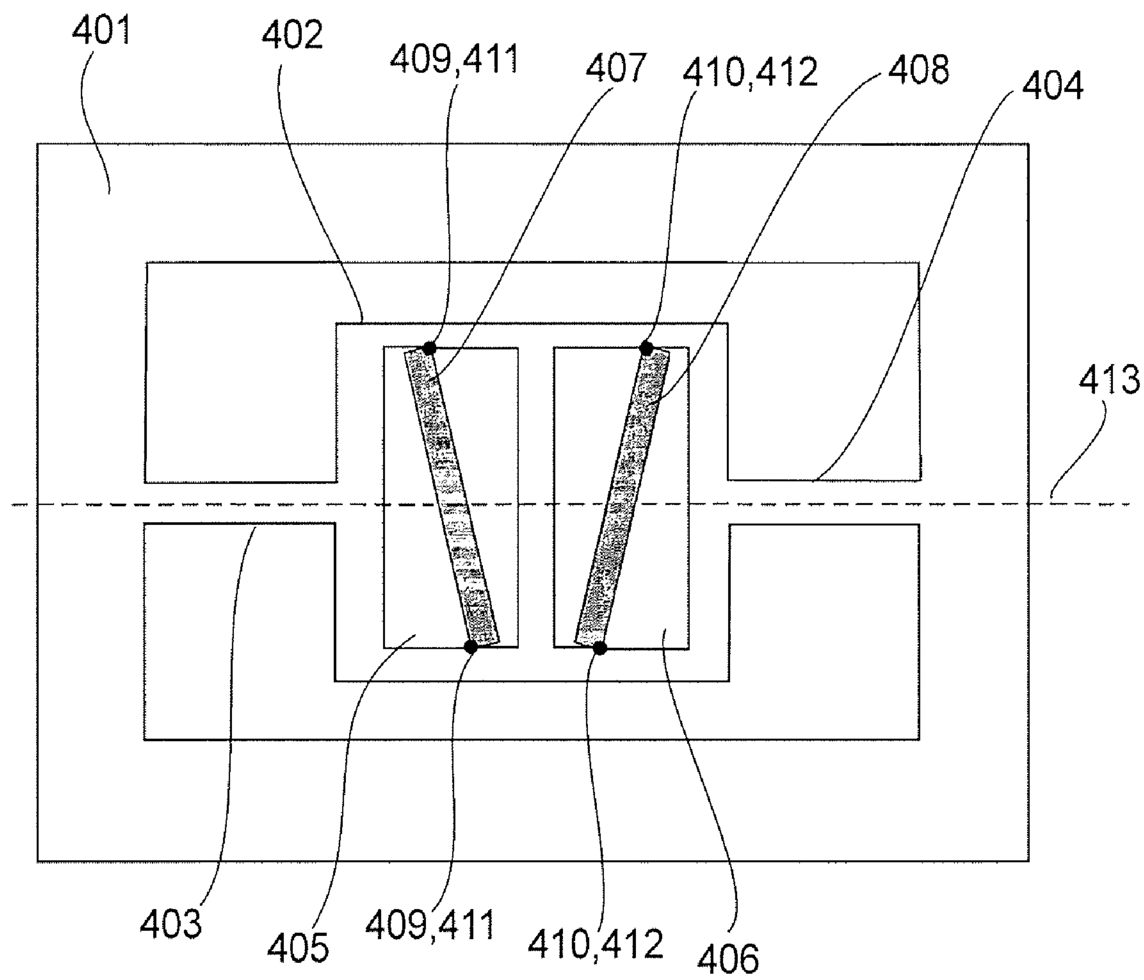
FIG. 6 is a schematic bottom view of a movable member, for explaining an optical deflector according to a second embodiment of the present invention.

Furthermore, in this form of the present invention, at least one hard magnetic member may be disposed obliquely with respect to a groove (recess) and it may be fixed by bringing the same into contact with mutually opposed end faces of the recess (see FIG. 6). This enables easy alignment in the sense mentioned hereinbefore. In that occasion, as an example, the diagonal length of the hard magnetic member may be made longer than the length of the groove, and the magnetic member may be inserted into the groove along the diagonal line thereof. While rotating the hard magnetic member, it may be fixed so that the end of the diagonal line of the hard magnetic member is aligned with the end face of the groove.

Figure 5A:
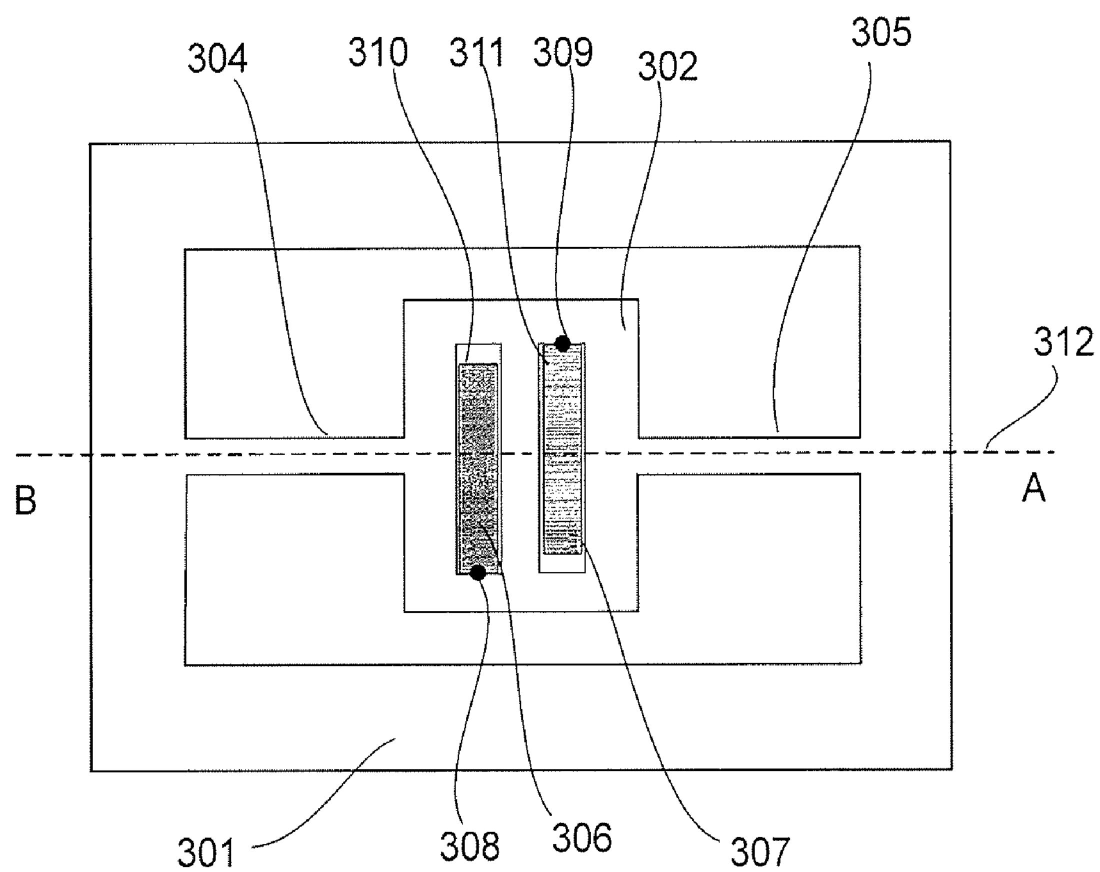
FIG. 5A is a schematic bottom view of a movable member of an optical deflector according to the first embodiment of the present invention.

As a further alternative, a plurality of recesses may be formed on the surface of the movable member, at opposite sides of the torsional axis and along the torsional axis, and the hard magnetic member may be fixed while being brought into contact with the end faces of these recesses. This corresponds to a disposition structure wherein the recess and hard magnetic member of FIG. 5A or FIG. 6 are rotated by about 90 degrees, while keeping the remaining portion unchanged. In that occasion, the hard magnetic member may be magnetized in its thickness direction, and a torque may be produced in the hard magnetic member by means of a magnetic field produced from an outside coil, to thereby cause torsional vibration of the movable member about the torsional axis. The principle of overcoming inconveniences through this structure will be the same as that described hereinbefore.

Furthermore, as shown in FIG. 7, recesses may be formed at the opposite surfaces of the movable member. In that occasion, each recess may be provided at a position that does not apply adverse influence to the reflection surface. As an alternative, provided that the gravity center coordinate of the movable member is kept in alignment with the torsional axis coordinate of the resilient support, the hard magnetic member may be fixed while hanging out of the recess.

Figure 4A:
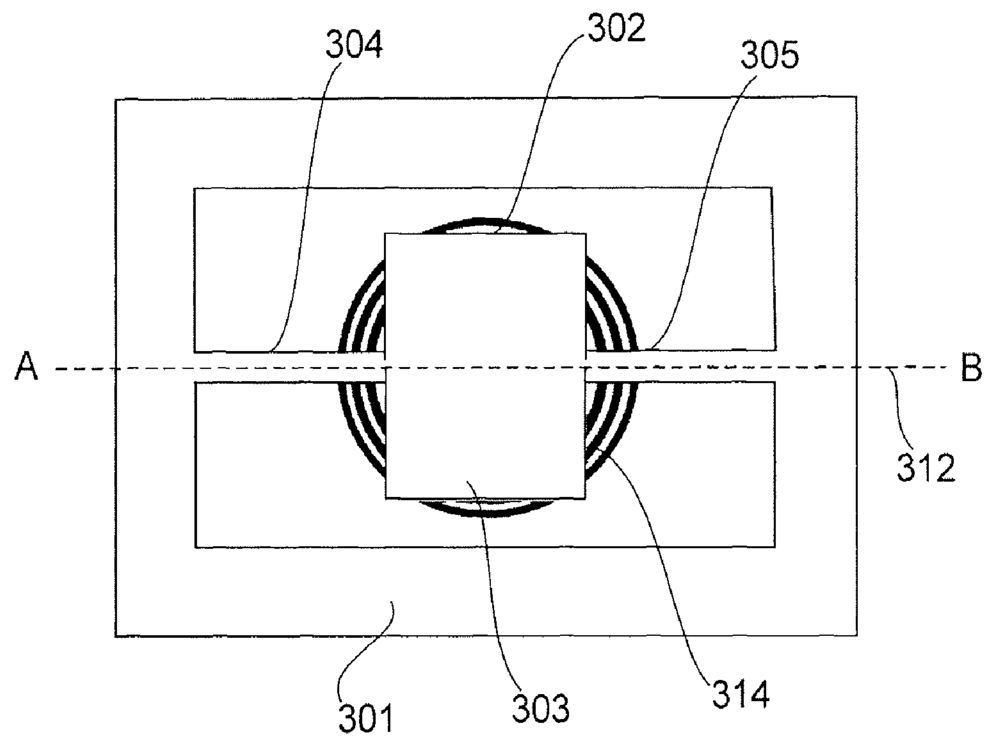
FIG. 4A is a schematic and top plan view of an optical deflector according to a first embodiment of the present invention.
Figure 4B:
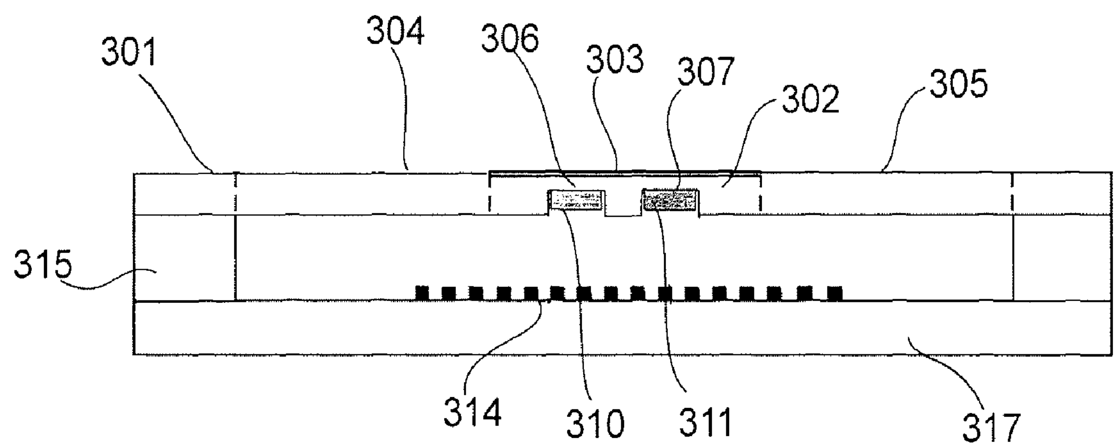
FIG. 4B is a schematic and sectional view, taken along a line A-B in FIG. 4A.
Figure 7A:
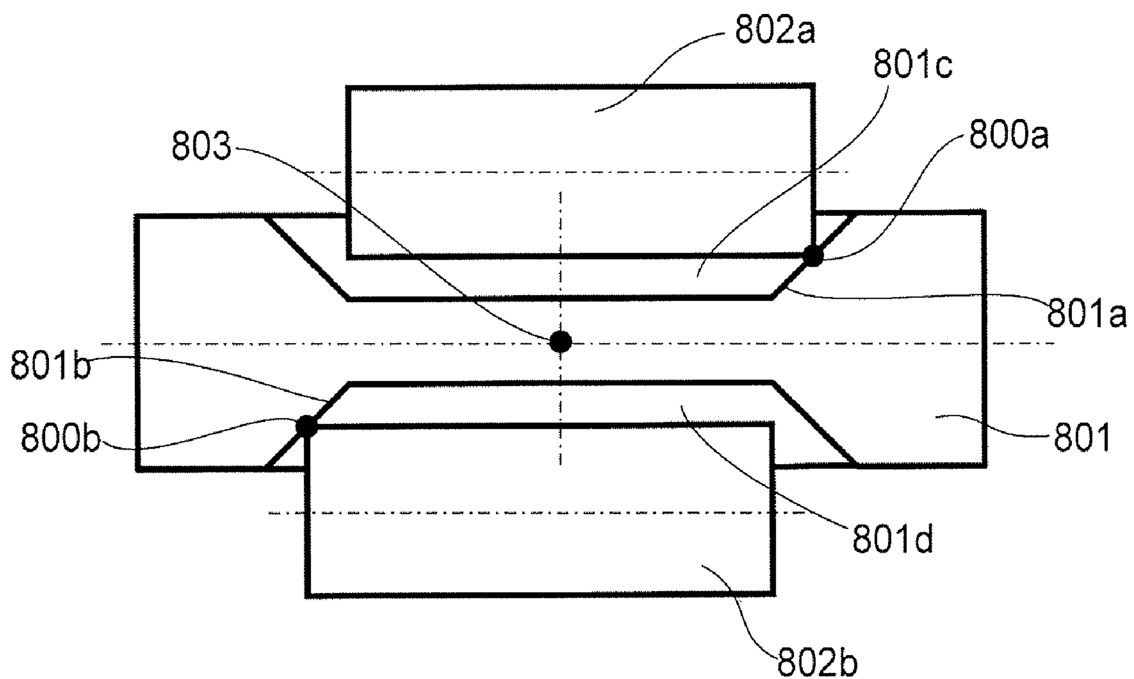
FIG. 7A is a schematic sectional view, for explaining a movable member of an optical deflector according to the present invention.
Figure 7B:
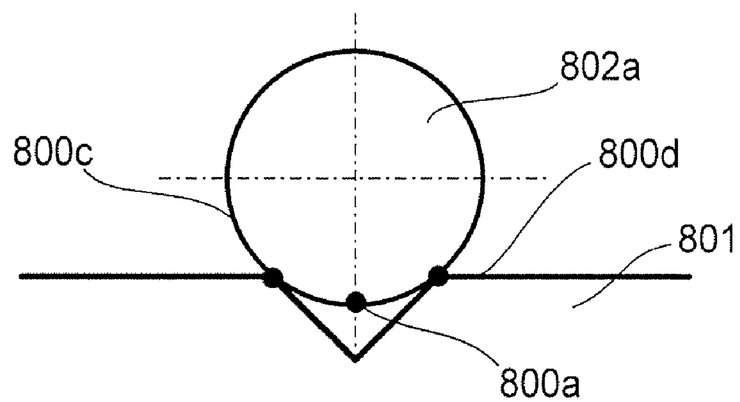
FIG. 7B is a schematic side view (right-hand side view), for explaining the relationship between a hard magnetic material having a cylindrical shape and a groove having a V-shaped section.

With regard to the sectional shape of the recess formed in the movable member, it may be such as shown at 306 and 307 in FIG. 4B or, alternatively, it may be V-shaped as shown in FIG. 7B. When the hard magnetic member is fixed while being in contact with the positioning reference of the recess, the hard magnetic member and the positioning reference may be in surface-contact with each other or, alternatively, they may be in line contact with each other. Furthermore, they may be in point contact with each other. If, for example, a hard magnetic member of cylindrical shape is going to be fixed to a recess such as shown at 306 or 307 in FIG. 4B, the hard magnetic member may be fixed while being in surface-contact with the end face of the recess. On the other hand, if a hard magnetic member of cylindrical shape is to be fixed to the end face of a recess having V-shape such as shown in FIG. 7B, the hard magnetic member and the end face of the recess may be in point-contact with each other at point 800*a* that corresponds to the positioning reference.

In an optical instrument such as image forming apparatus or image display device having an optical deflector as described above, deformation of the light spot on the object surface can be reduced to a tolerable range, and deterioration of the image quality can be prevented effectively.

Now, oscillating systems such as optical deflectors and optical instruments having such oscillating systems will be described in detail, with reference to specific examples.

Embodiment 1

Figure 5B:
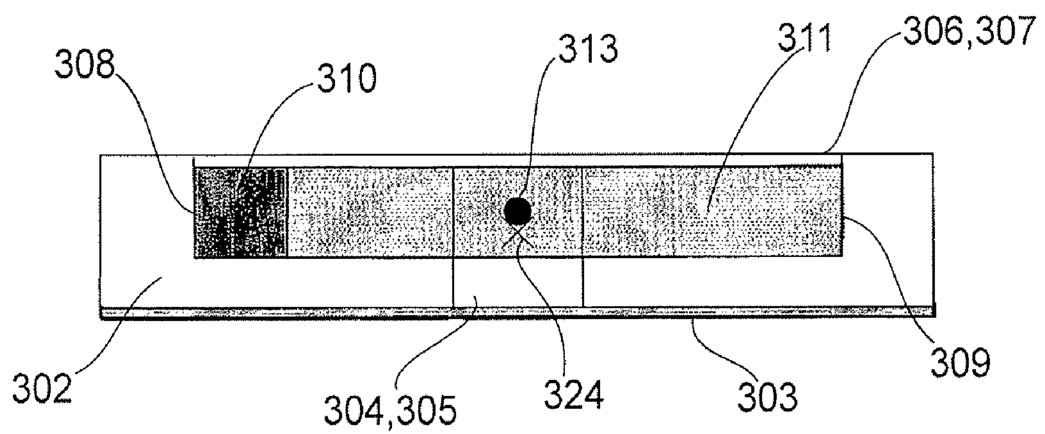
FIG. 5B is a schematic side view of the movable member according to the first embodiment of the present invention.

FIG. 4A is a schematic top plan view of an optical deflector according to the first embodiment of the present invention. FIG. 4B is a schematic and sectional view, taken along a line A-B in FIG. 4A. FIG. 5A is a schematic view of the bottom of a movable member, and FIG. 5B is a schematic side view of the movable member as viewed in the direction of “A” in FIG. 5A.

In the optical deflector of the first embodiment, a substrate 301 is made of silicon monocrystal. The substrate 301 is formed with a movable member 302 which is supported by two resilient supports 304 and 305 for torsional vibration. These two resilient supports 304 and 305 are disposed along a torsional axis 312. At a surface on one side of the movable member 302, there is a reflection surface 303 formed with a coating of aluminum or dielectric multilayered film or the like, having high reflectance.

On the surface at the other side of the movable member 302, there are grooves (recesses) 306 and 307 as shown in FIG. 5A, having a length of 1,000 μm in the lengthwise direction and extending across the torsional axis 312. These grooves are provided for the positioning of hard magnetic members (magnets) 310 and 311. These hard magnetic members 310 and 311 have a length 900 μm, and they are set and fixed while their end portions are held in contact with the groove end faces (positioning references) 308 and 309 of corresponding grooves 306 and 307, respectively. The length thereof is made longer than the sum of the length of the hard magnetic member 310 and the positioning error (e.g., 5 μm). Here, the shapes of the groove end faces 308 and 309 and the hard magnetic members 310 and 311 are designed beforehand to assure that the gravity centers of the hard magnetic members 310 and 311 are disposed alternately at opposite sides sandwiching the torsional axis 312 and that the gravity center 313 of the movable member 302 having these hard magnetic members is aligned with the torsional axis 312, in the sense described hereinbefore. For easy insertion of hard magnetic members into grooves, the width of each groove may preferably be made slightly larger than the width of the hard magnetic member. Although this may lead to slight inaccuracy of magnetic member positioning with respect to a direction along the torsional axis 312, such accuracy would not affect the alignment between the gravity center 313 of the movable member 302 with the torsional axis 312, in the sense described hereinbefore.

The hard magnetic members 310 and 311 are being magnetized in a direction approximately perpendicular to the torsional axis 312. In the example of FIG. 5A, grooves 306 and 307 are formed in a direction approximately perpendicular to the torsional axis 312. However, the direction may be such as follows: namely, it may be in a direction across the torsional axis 312 with an appropriate angle; and one magnetic pole of the hard magnetic members 310 and 311 to be fixed is placed at one side of the torsional axis 312 while the other magnetic pole is placed at the other side of the torsional axis 312.

Furthermore, provided that the gravity center 313 of the movable member 301 and the torsional axis 312 are aligned with each other in the sense described hereinbefore, only a single groove (recess) may be provided and the hard magnetic members may be fixed thereto as shown in FIG. 5A. As a further alternative, a single hard magnetic member may be provided and fixed to a single groove.

In this embodiment as shown in FIG. 4B, the substrate 301 is mounted on a stationary member (base) 317 through a spacer 315, and there is a coil 314 as magnetic field producing means which is disposed in a portion of the stationary member 317 which is opposed to the hard magnetic members 310 and 311.

In the structure described above, when an electric current is applied to the coil 314, the coil 314 produces a magnetic field. By means of this magnetic field, a torque about the torsional axis 312 is applied to the hard magnetic members 310 and 311 of the movable member 302, whereby the movable member 301 is driven.

In the manner described above, the hard magnetic members 310 and 311 are set and fixed while they are held in contact with the positioning references 308 and 309 of the grooves 306 and 307 which are provided to position the hard magnetic members 310 and 311. With this arrangement, as shown in FIG. 5B, any misalignment between the gravity center coordinate 313 of the movable member and the coordinate 324 of the torsional axis 312 of the resilient supports 304 and 305, with respect to a direction which is parallel to the reflection surface 303 and which is perpendicular to the torsional axis 312 of the resilient supports 304 and 305, can be reduced to a minimum. Hence, in this manner, deformation of the movable member due to its dead weight or any deviation of deformation from point-symmetrical deformation can be made smallest and, thus, degradation of optical performance of the reflection surface 303 can be avoided effectively.

Embodiment 2

An optical deflector according to a second embodiment of the present invention may have a similar structure as of the first embodiment. FIG. 6 is a bottom view for explaining an optical deflector according to this embodiment. In FIG. 6, a movable member 402 and resilient supports 403 and 404 are formed integrally with a substrate 401, by means of bulk micromachine technology. This embodiment differs from the first embodiment in that: two grooves (recesses) 405 and 406 are formed at the bottom of the movable member 402, and the diagonal length of magnets (hard magnetic members) 407 and 408 is made longer than the length of the grooves 406 and 407 in their lengthwise direction (i.e., a direction across the torsional axis 413). These magnets 407 and 408 are fixed so that the end portions 409 and 410 of the diagonal lines of the magnets 407 and 408 are in engagement with the end faces (positioning references) 411 and 412 of the grooves 406 and 407.

By fixing the magnets 407 and 408 in the manner described above, the gravity center coordinate of the movable member 402 in a direction parallel to the reflection surface and perpendicular to the torsional axis 413 of the resilient supports 403 and 404 can be approximately aligned with the coordinate of the torsional axis 413 of the resilient supports 403 and 404. Furthermore, the hard magnetic members 407 and 408 can be inserted along the diagonal lines of the two grooves 405 and 406 for positioning the magnets, and by rotating the hard magnetic members 407 and 408, they can be fixed so that the end portions 409 and 410 of the diagonal lines of the magnets 407 and 408 are aligned with the end faces (positioning references) 411 and 412 of the grooves 406 and 407, respectively. Hence, the gravity center coordinate of the movable member 402 can be easily aligned with the coordinate of the torsional axis 413.

With the structure of the optical deflector according to this embodiment of the present invention, deformation of the movable member 402 due to the self-weight thereof or any deviation of deformation from point-symmetrical deformation can be made smallest, and degradation of optical performance of the reflection surface can be prevented effectively. This embodiment may be modified essentially in similar ways as has been described with reference to the first embodiment.

Embodiment 3

FIG. 7A is a schematic and sectional view for explaining an optical deflector according to a third embodiment of the present invention. In this embodiment, a movable member 801 has elongating grooves 801*c* and 801*d* as recesses formed on opposite surfaces thereof. Hard magnetic members 802*a* and 802*b* having cylindrical shape are mounted on these recesses. The reflection surface is formed at a position remote from the position where the elongating grooves of V-shape in section are provided. As shown in FIG. 7B, the hard magnetic member of cylindrical shape displaces along the edges 800*c* and 800*d* of the V-shaped groove and it is fixed while a single point (positioning reference) 800*a* or 800*b* at the end face of the hard magnetic member 802*a* or 802*b* is brought into contact with a slant surface 801*a* or 801*b* of the V-shaped groove.

The V-shaped elongating grooves of the movable member themselves are formed on both surfaces of the movable member rotationally symmetrically with respect to the torsional axis 803. The gravity center of the whole structure including the cylindrical hard magnetic members is put on the torsional axis 803 and, therefore, deformation of the reflection surface under torsional motion of the movable member or the attitude of the reflection surface would be unchanged. If the diameter of the hard magnetic member is small, the portion where the hard magnetic member and the V-shaped groove are in contact with each other may be a slant surface, rather than the edge portion of the elongating V-shaped groove.

Embodiment 4

Figure 8:
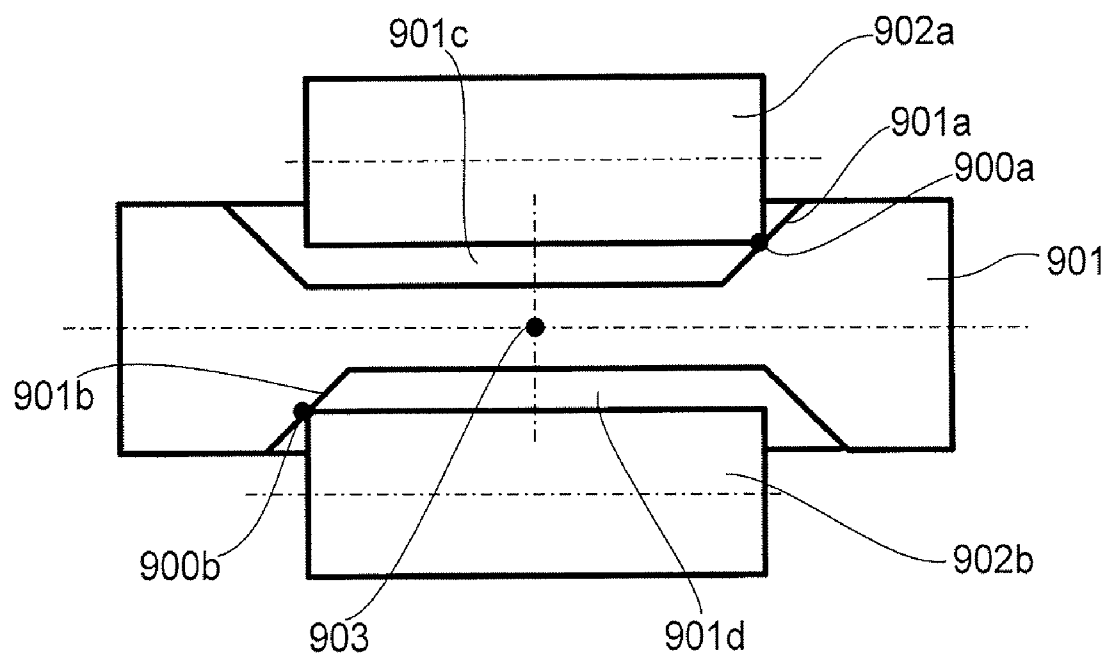
FIG. 8 is a schematic sectional view of a movable member of an optical deflector according to the present invention, in an example wherein grooves at opposite surfaces are mutually deviated.

FIG. 8 is a schematic and sectional view for explaining a movable member 901 in a fourth embodiment of the present invention. In this embodiment as well, grooves 901*c* and 901*b* are formed on opposite surfaces of the movable member, and hard magnetic members 902*a* and 902*b* are mounted thereinto. In this embodiment, the positions where the V-shaped grooves are formed are made symmetric with respect to the torsional axis of the movable member. More specifically, like the third embodiment, the hard magnetic members 902*a* and 902*b* are fixed while they are brought into contact with slant surfaces 901*a* and 901*b* at the end portions of the V-shaped groove and are positioned by means of positioning references 900*a* and 900*b* defined at the slant surfaces.

In this embodiment, the V-shaped grooves 901*c* and 901*d* are formed so that the positions of the hard magnetic members disposed on the opposite surfaces of the magnetic member are vertically symmetrical with respect to a plane which extends through the torsional axis and which is parallel to the surface of the movable member. The hard magnetic members have a relatively large specific gravity and, by removing displacement of the hard magnetic member from the torsional axis (displacement in lateral directions as viewed in FIG. 8) as described, any deviation of the gravity center of the whole structure can be made small. Hence, although the positions themselves of the grooves are mutually deviated rotationally symmetrically on the opposite surfaces of the movable member, since the gravity center of the whole structure is put on the torsional axis, deformation of the reflection surface under torsional motion or the attitude of the reflection surface would be unchanged.

Embodiment 5

Figure 9:
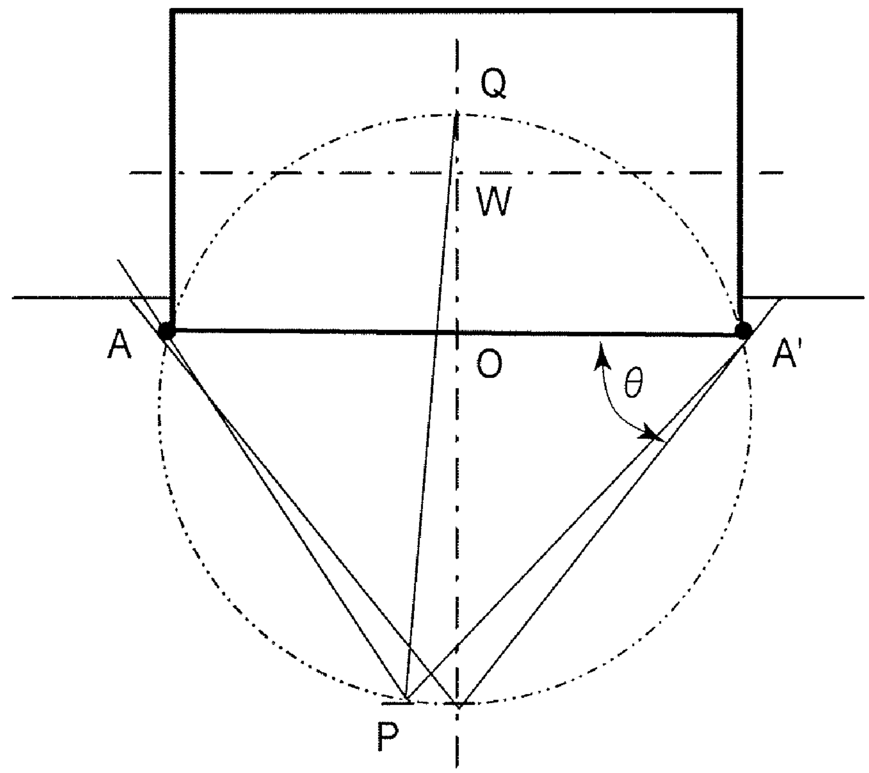
FIG. 9 is a schematic view for explaining geometrical relationship between the V-shaped groove and the magnet, in an embodiment of the present invention.

FIG. 9 is a schematic view for explaining a movable member in a fifth embodiment of the present invention, and it shows an example wherein a single lower point 1000*b* or 1000*c* at the opposite ends of each cylindrical hard magnetic member 1002 follows the groove slant surface. In this embodiment, grooves each comprising an elongating groove having V-shape in section are formed on the opposite surfaces of the movable member 1001, and slant surfaces are formed at end portions of each groove. Hence, as long as a single point at the opposite ends of the hard magnetic member is kept in contact with a corresponding slant surface, positioning of the cylindrical hard magnetic member is assured. If the angle θ of the groove slant surface is θ=54.7 deg. and the length of the cylindrical hard magnetic member is 1, the position 0.35 at the center of the hard magnetic member will be a geometrically steady point with respect to the tilt of the hard magnetic member. For simplicity of explanation, in the drawing the cylindrical hard magnetic member side is illustrated as being fixed while the groove is tilted.

A segment A-A' is the length of the hard magnetic member, and points A and A' are contact points with the slant surfaces. Denoted at P is an extension point of the slant surfaces. It is seen from the drawing that the angle APA' is constant and, thus, the point P is on the circumference. If the point of intersection between this circumference and a bisector of the angle APA' is denoted by Q, it is seen that the point Q is a steady point. If the point Q and the gravity center W of the hard magnetic member 1002 are aligned with each other, it means that there is no positional deviation of the gravity center with respect to the tilt of the hard magnetic member. Then, once the lengths of the hard magnetic members 1002 and the grooves are selected appropriately, any positional deviation of the gravity center can be avoided by inserting the hard magnetic members into the grooves at the opposite surfaces of the movable member and disposing them in parallel to the surface of the movable member.

Embodiment 6

Figure 10A:
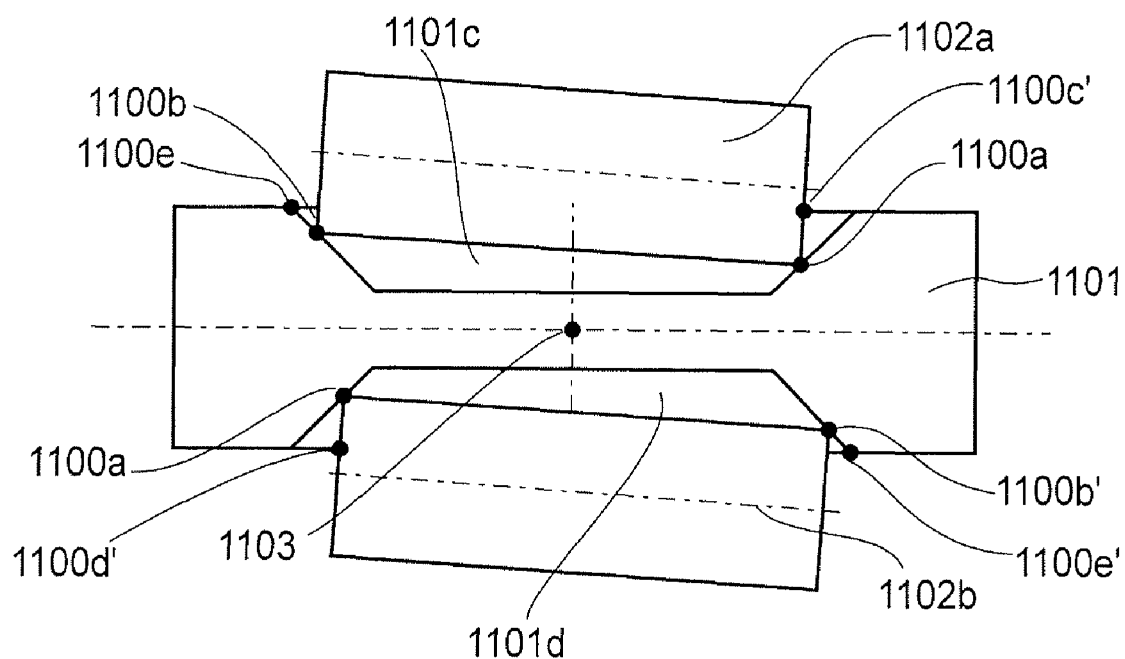
FIG. 10A is a schematic and sectional view for explaining a movable member of an optical deflector according to an embodiment of the present invention.

FIG. 10A concerns a sixth embodiment of the present invention, and it illustrates an example wherein hard magnetic members are disposed in parallel so as to correct even small deviation of the gravity center to be produced in the movable member 1101. In this embodiment, grooves 1101*c* and 1101*c* have a V-shape, and cylindrical hard magnetic members 1102*a* and 1102*b* are made longer than those of the preceding embodiments and, therefore, they are fixed with tilt into the grooves. In FIG. 10A, the hard magnetic member 1102*a* is fixed by means of the position 1100*a*, the edge portions 1100*c* and 1100*c*' at the opposite ends of the B-shaped groove, and the position 1100*b*. On the other hand, the hard magnetic member 1102*b* is fixed by means of the position 1100*a*', the edge portions 1100*d* and 1100*d*' at the opposite ends of the V-shaped groove, and the position 1100*b*'. If the length of the hard magnetic member is large, the hard magnetic member 1102*a* or 1102*b* will stick out of the groove and engages with the edge portion 1100*e* or 1100*e*' of the groove. When the hard magnetic members are fixed in this manner, they should be disposed in parallel to each other.

Figure 10B:
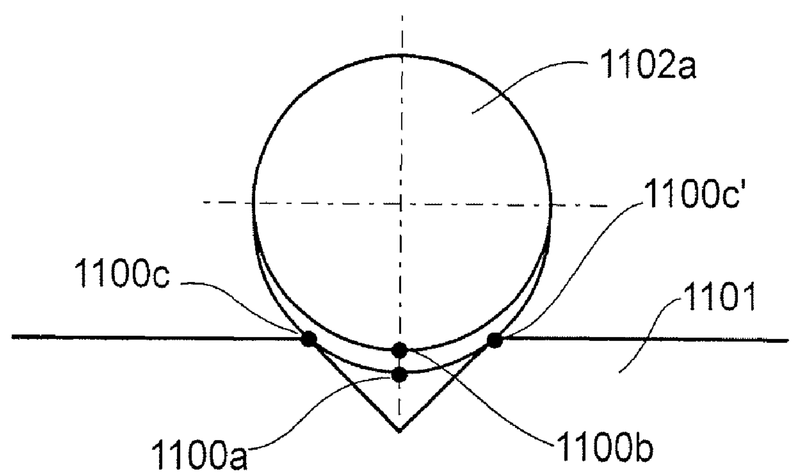
FIG. 10B is a schematic side view (right-hand side view) for explaining the relationship between a cylindrical hard magnetic member and a V-shaped elongating groove.
Figure 10C:
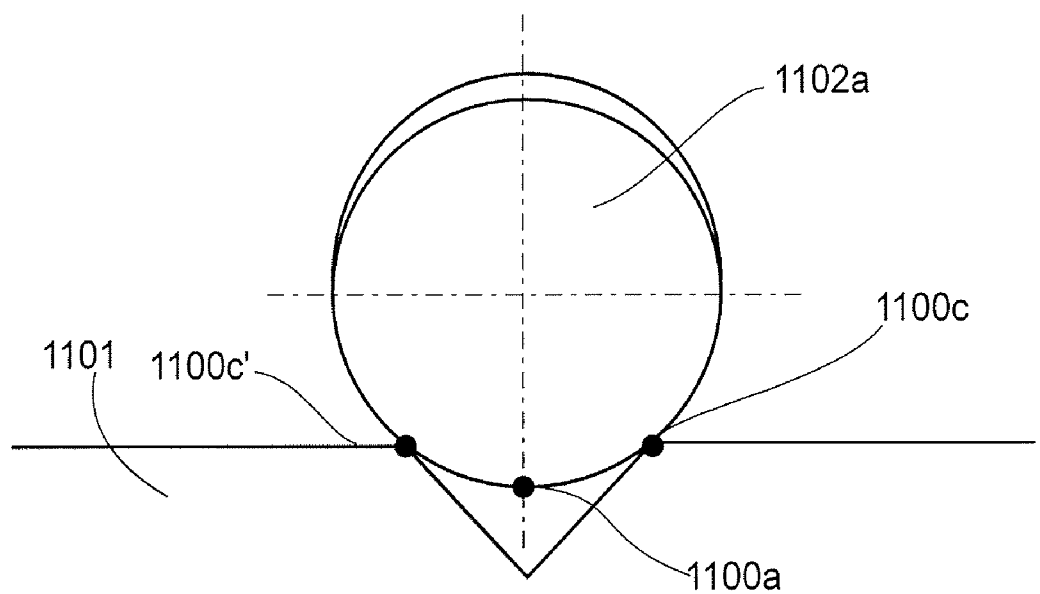
FIG. 10C is a schematic side view (left-hand side view) for explaining the relationship between a cylindrical hard magnetic member and a V-shaped elongating groove.

FIG. 10B is a schematic side view of a cylindrical hard magnetic member as seen from the left-hand side thereof in FIG. 10A. The cylindrical hard magnetic member is in contact with the V-shaped groove at positions 1100*a* and 1100*b*. Further, at positions 1100*c* and 1100*c*', it is in contact with the edges of the V-shaped groove. FIG. 10C is a schematic side view, as seen from the right-hand side, wherein the cylindrical hard magnetic member is in contact with the V-shaped groove at positions 1100*a* and 1100*b* (not shown), while it is in contact with the edges of the V-shaped groove at positions 1100*c* and 1100*c*'. By disposing the cylindrical hard magnetic members in parallel with each other as in this embodiment, any deviation of gravity center can be reduced effectively. Hence, deformation of the reflection surface or any change in attitude of the reflection surface, caused by deviation of the gravity center under torsional motion, can be avoided or reduced effectively.

Embodiment 7

This embodiment concerns an example wherein an optical deflector according to the present invention is incorporated into an image display device.

Figure 11:
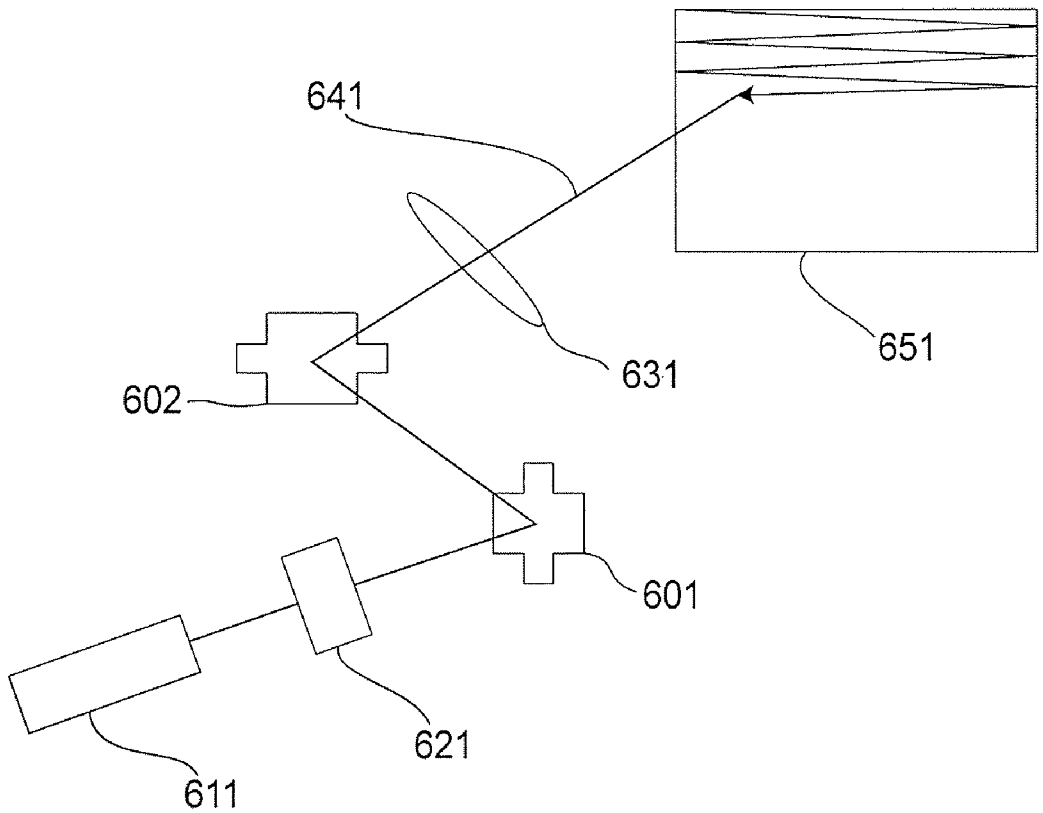
FIG. 11 is a schematic view for explaining an image display device according to a third embodiment of the present invention.
Figure 12:
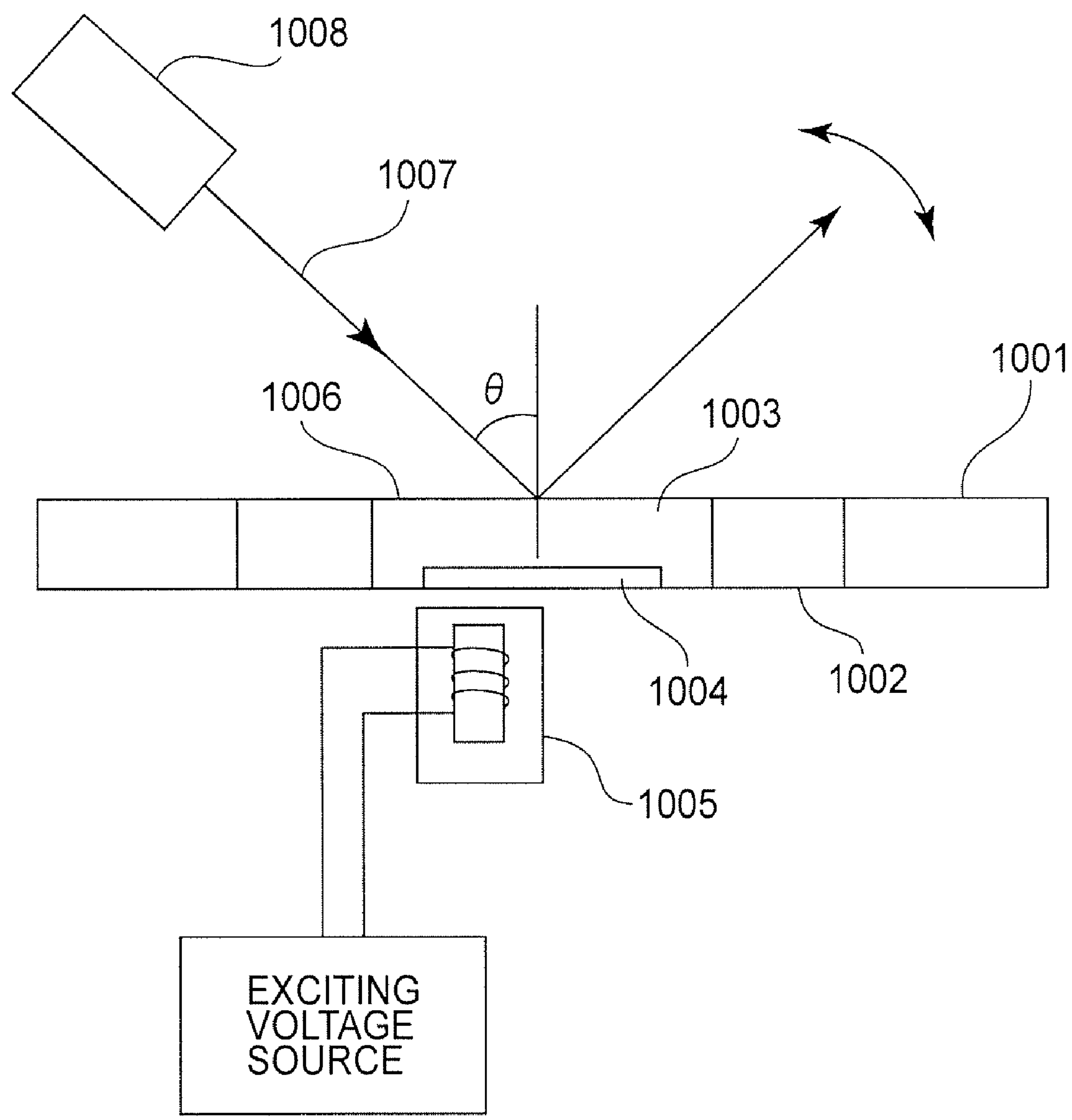
FIG. 12 is a schematic and side view for explaining a conventional optical deflector.

FIG. 11 is a schematic view for explaining an image display device according to this embodiment of the present invention. There are optical deflectors 601 and 602 each being prepared in accordance with any one of the preceding embodiments, and these optical deflectors are disposed so that their deflecting directions extend orthogonally to each other. With this arrangement, input light can be scanningly deflected in vertical and horizontal directions. More specifically, laser light 641 supplied from a laser light source 611 is modulated in intensity by means of an optical intensity modulator 621 and, then, by means of the optical deflectors 601 and 602, it is scanned two-dimensionally.

The laser light source 611 may comprise light sources of red, blue and green, and these lights may be mixed together by means of a color mixing light source system. The laser light thus scanned is projected by a lens 631 onto a projection surface 651, whereby an image is formed thereon.

In this type of image display devices, if the surface precision of the reflection surface of the optical deflector decreases or the attitude of the reflection surface changes, the image quality at the projection surface would be degraded. In accordance with this embodiment of the present invention, optical deflectors according to any one of the preceding embodiments are used, by which degradation of the flatness of the reflection surface of the optical deflector and deviation of deformation from point-symmetrical deformation can be avoided effectively. Furthermore, since any change in attitude of the reflection surface is prevented, image quality degradation can be avoided.

It should be noted here that the optical deflector of the present invention is applicable to any other optical instrument such as an image forming apparatus based on electrophotographic method and having a photosensitive member, for example.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2005-356139 filed Dec. 9, 2005, for which is hereby incorporated by reference.

What is claimed is:

1. An oscillating system, comprising:

a substrate;

a movable member having a plurality of hard magnetic members;

a resilient support for supporting said movable member for torsional vibration with respect to said substrate; and a magnetic field producing device for producing a magnetic field so as to cause vibration of said movable member;

wherein said movable member includes a plurality of recesses having at least one positioning reference for determining the position of said hard magnetic members, and wherein said hard magnetic members are disposed across an axis of the torsional vibration, and are abutted to said at least one positioning reference so that centers of gravity of said hard magnetic members are alternately positioned at opposite sides of the axis, and wherein each of said hard magnetic members is fixed while an end portion thereof is aligned with said at least one positioning reference.

2. An oscillating system according to claim 1, wherein said movable member has a plurality of hard magnetic members which are fixed while being aligned with respect to a plurality of positioning references at opposite sides of a torsional axis of the torsional vibration.

3. An oscillating system according to claim 1, wherein said hard magnetic members are magnetized along lengthwise directions thereof.

4. An oscillating system according to claim 1, wherein plural positioning references are provided at opposite surfaces of said movable member.

5. An oscillating system according to claim 4, wherein said plural positioning references are axially symmetrical with respect to a torsional axis of the torsional vibration.

6. An optical deflector characterized by having an oscillating system as recited in claim 1 and an optical deflecting element disposed at a movable member of said oscillating system.

7. An optical instrument characterized by a light source and an optical deflector as recited in claim 6, wherein light from said light source is deflected by said optical deflector so that at least a portion of the light is projected onto one of an image display member and a photosensitive member.

* * * * *